(12) United States Patent
Kim

(10) Patent No.: US 7,813,212 B2
(45) Date of Patent: Oct. 12, 2010

(54) NONVOLATILE MEMORY HAVING NON-POWER OF TWO MEMORY CAPACITY

(75) Inventor: Jin-Ki Kim, Kanata (CA)

(73) Assignee: MOSAID Technologies Incorporated, Ottawa (CA)

( * ) Notice: Subject to any disclaimer, the term of this patent is extended or adjusted under 35 U.S.C. 154(b) by 282 days.

(21) Appl. No.: 12/042,551

(22) Filed: Mar. 5, 2008

(65) Prior Publication Data

US 2009/0187798 A1  Jul. 23, 2009

Related U.S. Application Data

(60) Provisional application No. 61/021,662, filed on Jan. 17, 2008.

(51) Int. Cl.
*G11C 8/00* (2006.01)
(52) U.S. Cl. .................. 365/230.03; 365/185.09; 365/185.04; 365/185.11; 365/185.17
(58) Field of Classification Search ............ 365/185.11, 365/185.17, 185.04, 185.09; 714/710, 723
See application file for complete search history.

(56) References Cited

U.S. PATENT DOCUMENTS

| | | | |
|---|---|---|---|
| 5,093,805 A | 3/1992 | Singh | |
| 5,220,518 A | 6/1993 | Haq | |
| 5,854,763 A | 12/1998 | Gillingham et al. | |
| 6,816,407 B2 | 11/2004 | Rolandi | |
| 6,965,523 B2 | 11/2005 | Rolandi | |
| 7,313,022 B2 * | 12/2007 | Takeuchi et al. | 365/185.09 |
| 2007/0201279 A1 | 8/2007 | Nakamura et al. | |
| 2007/0206419 A1 | 9/2007 | Makino | |
| 2007/0246807 A1 | 10/2007 | Hara et al. | |
| 2008/0133824 A1 * | 6/2008 | Kim | 711/103 |
| 2009/0046512 A1 * | 2/2009 | Halloush et al. | 365/185.09 |
| 2009/0204747 A1 | 8/2009 | Lavan et al. | |

OTHER PUBLICATIONS

Imamiya, K. et al., "A 125-mm2 1-Gb NAND Flash Memory with 10-MByte/s Program Speed", IEEE Journal of Solid-State Circuits, vol. 37, No. 11, Nov. 2002, pp. 1493-1501.

(Continued)

*Primary Examiner*—Pho M Luu
*Assistant Examiner*—Tha-O Bui
(74) *Attorney, Agent, or Firm*—Daniel A. Hammond

(57) ABSTRACT

A nonvolatile memory having a non-power of two memory capacity is provided. The nonvolatile memory device includes at least one plane. The plane includes a plurality of blocks with each of the blocks divided into a number of pages and each of the blocks defined along a first dimension by a first number of memory cells for storing data, and along a second dimension of by a second number of memory cells for storing data. The nonvolatile memory has a non-power of two capacity proportionally related to a total number of memory cells in said plane. The nonvolatile memory also includes a plurality of row decoders. An at least substantially one-to-one relationship exists, in the memory device, for number of row decoders to number of pages. Each of the row decoders is configured to facilitate a read operation on an associated page of the memory device.

13 Claims, 8 Drawing Sheets

OTHER PUBLICATIONS

Lee J. et al., "A 90-nm CMOS 1.8-V 2Gb NAND Flash Memory for Mass Storage Applications", IEEE Journal of Solid-State Circuits, vol. 38, No. 11, Nov. 2003. pp. 1934-1942.

Takeuchi, K. et al, "A 56nm CMOS 99mm2 8Gb Multi-level NAND Flash Memory with 10MB/s Program Throughput", Solid-State Circuits, 2006 IEEE International Conference Digest of Technical Papers, Session 7, Feb. 6-9, 2006, pp. 507-516, ISBN: 1-4244-0079-1.

Samsung Electronics Co. Ltd, "2G× 8 Bit NAND Flash Memory", K9GAG08U0M, Apr. 12, 2006, pp. 1-48.

Toshiba, "16 GBIT (2G× 8 Bit) CMOS NAND E2PROM (Multi-Level-Cell)", TC58NVG4D1DTG00, Nov. 9, 2006, pp. 1-64.

Choi, Young, "16-Gbit MLC NAND Flash Weighs In", EETimes. com, Jul. 7, 2007, pp. 1-3, http://www.eetimes.com/showArticle.jhtml?articleID=201200825.

\* cited by examiner

NONVOLATILE MEMORY HAVING NON-POWER OF TWO MEMORY CAPACITY

BACKGROUND OF THE DISCLOSURE

Today, many electronic devices include memory systems to store information. For example, some memory systems store digitized audio or video information for playback by a respective media player. Other memory systems store software and related information to carry out different types of processing functions. Also, some types of memory systems such as, for example, Dynamic Random Access Memory (DRAM) systems and Static Random Access Memory (SRAM) systems are volatile memory systems in that stored data is not preserved when the power is off, whereas other types of memory systems such as, for example, NAND flash memory systems and NOR flash memory systems are nonvolatile memory systems in that stored data is preserved when the power is off.

Typically the memory capacity of a memory system, regardless of whether the system is "volatile" or "nonvolatile", is doubled for every generation because of the nature of binary address bit structure in computing systems. Amongst those skilled in the art, it is commonly understood that doubled memory capacity (power of two memory capacity) is a requirement that should be complied with if it is used in main memory system. Furthermore, although there have been some previous proposals for non-power of two memory capacity in a volatile memory system, at least in the context of nonvolatile memory systems there apparently does not currently exist any practical way of producing memory systems having non-power of two memory capacity.

It would of course be useful to be able to produce a nonvolatile memory system having non-power of two memory capacity. In this regards, one problem with doubling memory capacity without scaling down the process technology is that the associated circuits and components of larger size can usually no longer fit within the same package because of physical constraints such as, for example, physical size increase might be limited to increase in one dimension and the needed increase in size could be outside of definitive limits for any potential increase in size. Furthermore, changing the package may not be an option because industry adopts standard packages such as, for example 48-pin TSOP-1. Thus, the impact of switching from a standard package to a non-standard package may, in some cases, be as consequential as having to redesign the entire printed circuit board.

Given the problems posed by increasing physical size while staying within the same package, scaling down the process technology is the remaining alternative option that is considered; however scaling down the process technology is a huge investment. In many circumstances, it would be substantially more cost feasible to increase memory capacity without having to scale down the process technology.

SUMMARY

It is an object of the invention to provide an improved nonvolatile memory.

According to one aspect of the invention, there is provided a nonvolatile memory device that includes at least one plane. The plane includes a plurality of blocks with each of the blocks divided into a number of pages and each of the blocks defined along a first dimension by a first number of memory cells for storing data, and along a second dimension of by a second number of memory cells for storing data. The nonvolatile memory has a non-power of two capacity proportionally related to a total number of memory cells in a data section of the plane. The nonvolatile memory also includes a plurality of row decoders. An at least substantially one-to-one relationship exists, in the memory device, for number of row decoders to number of pages. Each of the row decoders is configured to facilitate a read operation on an associated page of the memory device.

According to another aspect of the invention, there is provided a memory system that includes at least one nonvolatile memory device that has at least one plane. The plane includes a plurality of blocks, with each of the blocks divided into a number of pages. Each of the blocks are defined along a first dimension by a first number of memory cells for storing data, and along a second dimension of by a second number of memory cells for storing data. The memory device has a non-power of two capacity proportionally related to a total number of memory cells in a data section of the plane. A controller is in communication with the memory device. The controller includes storage and a management module. The storage stores a map table. The management module is configured to access the map table to carry out translation of logical addresses to physical addresses. Invalid physical addresses attributable to the non-power of two capacity of the memory device are mapped out in the map table.

According to yet another aspect of the invention, there is provided a method of filling a memory controller table with data. The table is stored in a random access memory of a memory controller. The memory controller is in communication with at least one nonvolatile memory device having at least one memory cell array storing the data for management functions of the memory controller. The at least one memory cell array has a non-power of two capacity. The method includes retrieving the data from the at least one memory cell array. The method also includes processing the data in the memory controller to determine invalid physical addresses attributable to the non-power of two capacity of the at least one memory cell array. The method also includes modifying the memory controller table to map out the invalid physical addresses.

Thus, an improved nonvolatile memory has been provided.

BRIEF DESCRIPTION OF THE DRAWINGS

Reference will now be made, by way of example, to the accompanying drawings.

Similar or the same reference numerals may have been used in different figures to denote similar components.

DETAILED DESCRIPTION OF EXAMPLE EMBODIMENTS

In many of the electronic devices, the memory systems often comprise a controller and one or more corresponding flash memory devices. The controller typically includes circuitry configured to generate signals to the memory devices for storage and retrieval of data from the flash memory devices.

Figure 1:
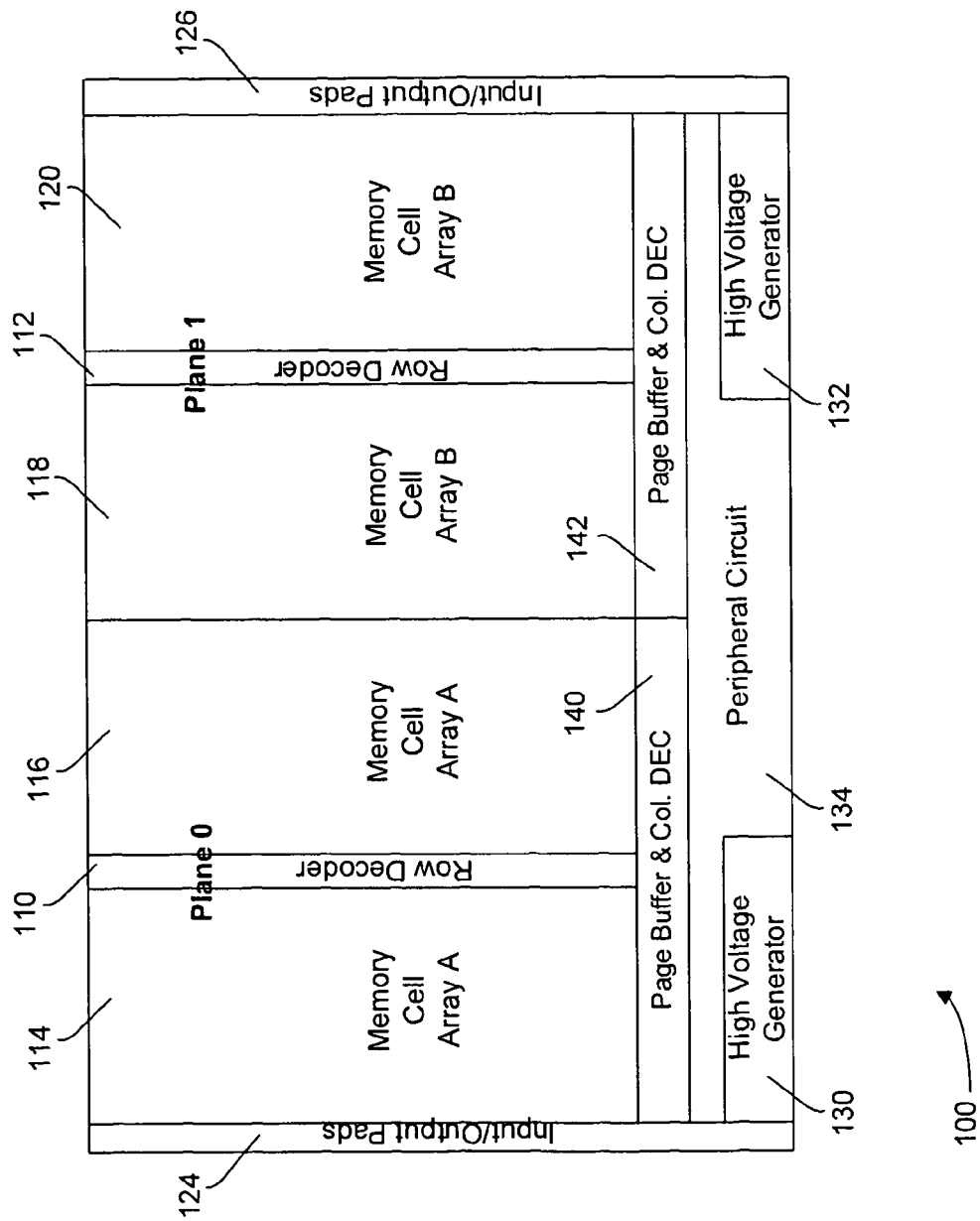
FIG. 1 is a block diagram of an example NAND flash chip floor plan.

Referring now to the drawings, FIG. 1 is a block diagram of an example NAND flash chip floor plan 100 illustrating the actual placement of major components within the chip area of the flash memory device. In the floor plan 100, two row decoder areas 110 and 112 extend between adjacent memory cell array areas 114 and 116, and 118 and 120 respectively. With respect to row decoder areas 110 and 112, it is within these areas that the row decoders of the flash memory device can be found. With respect to memory cell array areas 114, 116, 118 and 120, it is within these areas that the memory cell arrays of the flash memory device can be found.

Extending along width-wise edges of the floor plan 100 are input/output pad areas 124 and 126, and extending along length-wise edges of the floor plan 100 are high voltage generator areas 130 and 132, and peripheral circuit area 134. With respect to input/output pad areas 124 and 126, it is within these areas that the input/output pads of the flash memory device can be found. With respect to high voltage generator areas 130 and 132, it is within these areas that one finds the high voltage generators of the flash memory device such as, for example, charge pumps. With respect to peripheral circuit area 134, it is within this area that other circuitry important for device operation such as, for example, control circuitry can be found. Also, adjacent peripheral circuit area 134 are additional circuit areas 140 and 142. It is within these areas that the page buffers and column decoders of the flash memory device can be found.

Those skilled in the art will appreciate that chip floor plans for non-volatile memories will vary, within working constraints and specifications, depending on the choice of the designer. For example, Toshiba Corporation produces some two plane, non-volatile memory devices with a row decoder area extending between two relatively adjacent edges of the areas of the planes. Comparing the floor plan of a the Toshiba memory device to the floor plan 100, one might find the following differences (non-exhaustive list): the row decoder area extends down the center of the floor plan rather than having two spaced-apart row decoder areas, only a single high voltage generator area, input/output pad areas which extend along the edge that is adjacent the peripheral circuit area.

Figure 2:
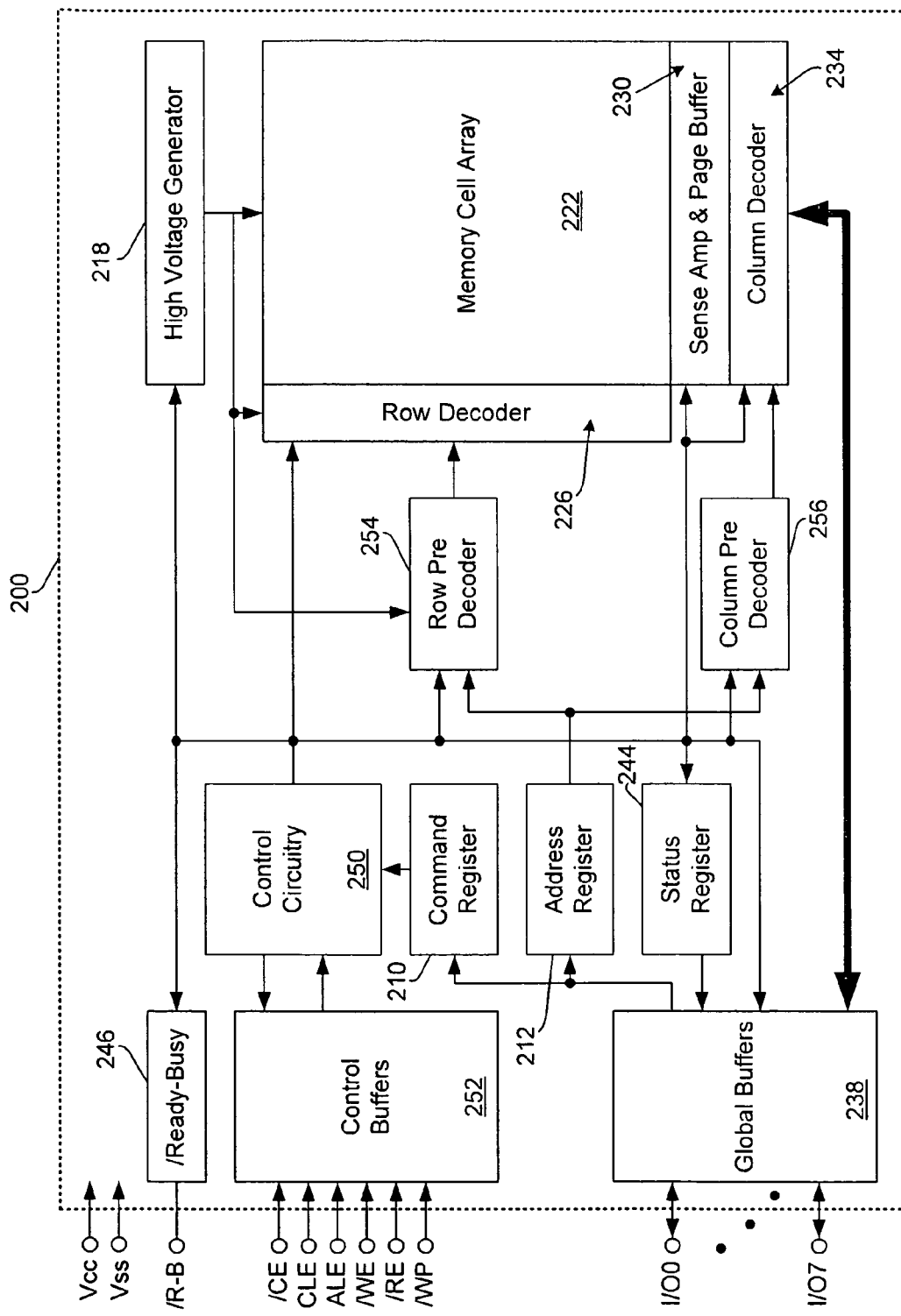
FIG. 2 is a functional block diagram of an example NAND flash memory.

Referring now to FIG. 2, there is shown a functional block diagram of an example NAND flash memory device 200. The device 200 has common input and output port (I/O pins 0 to 7) for transferring address, command and input/output data to and from the device 200. The illustrated device 200 also includes a Command Latch Enable (CLE) port. A CLE input signal to the port is used to control loading of the operation mode command into an internal command register 210. The command is latched into the command register 210 from the I/O port on the rising edge of the /WE signal while CLE is logic high. The illustrated device 200 also includes an Address Latch Enable (ALE) port. The ALE signal to the port is used to control loading address information into an internal address register 212. Address information is latched into the address register 212 from the I/O port on the rising edge of the /WE signal while ALE is logic high. Along with an Address Latch Enable (ALE) port, the illustrated device 200 also includes a Chip Enable (/CE) port. In particular, the device 200 goes into a low-power Standby mode when /CE goes logic high when the device 200 is in a Ready state. By contrast, the /CE signal is ignored when the device 200 is in a Busy state (i.e. /R-B is logic low), such as during a Program or Erase or Read operation, and the device 200 will not enter the Standby mode even if the /CE input goes logic high.

The illustrated device 200 also includes ports for enabling write and read operations. A Write Enable (/WL) port receives a /WL signal, which is used to control the acquisition of data from the I/O port. A Read Enable (/RE) port receives an RE signal for controlling serial data output. Data is available after the falling edge of /RE. An internal column address counter [not explicitly shown] is also incremented (Address=Address+1) on this falling edge.

The illustrated device 200 also includes a Write Protect (/WP) port. The /WP port receives a /WP signal that is used to protect the device 200 from accidental programming or erasing. An internal voltage regulator (high voltage generator 218) is reset when /WP is logic low. The /WP signal is usually used for protecting the data during a power-on/off sequence when input signals are invalid. Along with a Write Protect (/WP) port, the illustrated device 200 also includes a Ready/Busy (/R-B) port. The /R-B port comprises an open drain pin, and the transmitted output signal is used to indicate the operating condition of the device. The /R-B signal is in a Busy state (/R-B is logic low) during the Program, Erase and Read operations and will return to a Ready state (/R-B is logic high) after completion of the operation.

Still with reference to FIG. 2, the memory core of the illustrated device 200 comprises memory cell array 222, row decoder 226, sense amplifier and page buffer 230, and column decoder 234. With respect to the row decoder 226, a page for either a read or program operation is selected by it. For an erase operation, the row decoder 226 selects a block, which is a subdivision of the memory cell array 222 defined along a first dimension by a first number of memory cells that store data, and along a second dimension of by a second number of other memory cells. Also, it will be understood that, in the context of flash and other similar nonvolatile memories, a block is a larger subdivision of the memory cell array 222 than a page. In terms of subdivision hierarchy, a plane of a memory device includes a plurality of blocks with each of the blocks divided into a number of pages.

Continuing on with the description of operations, with respect to the data of a page that is selected by the row decoder 226 in connection with a read operation, the data is sensed and latched into the sense amplifier and page buffer 230 during the read operation. After that, the data stored in the page buffer and is sequentially read out through the column decoder 234 and global buffers 238. The global buffers 238 temporarily hold and buffer input and output data via common I/O pins. During programming, the input data from the global buffers 238 are sequentially loaded into the page buffer via the column decoder 234. The input data latched in the page buffer are finally programmed into the selected page.

Electrically connected to the memory cell array 222, the high voltage generator 218 provides necessary high voltages and reference voltages during read, program and erase operations. To track device status during read, program or erase operations, the illustrated device 200 includes a status register 244. Also, /Ready-Busy (/R-B) circuitry 246 and a connected /R-B pin together provide another indicator for device status. In at least some examples, the /R-B circuitry 246 includes an open drain transistor [not explicitly shown].

The illustrated device 200 also includes control circuitry 250 which, in at least some examples, is a central unit. The control circuitry 250 enables control of the device 200 during various operating modes. In electrical communication with the control circuitry 250 are control buffers 252 which act as buffers for the control circuitry 250.

The illustrated device 200 also includes a row pre decoder 254 and a column pre decoder 256. The row pre decoder 254 is intermediate the address register 212 and the row decoder 226. The row pre decoder 254 transfers, to the row decoder 226, multiplexed row addresses stored in the address register 212. The column pre decoder 256 is intermediate the address register 212 and the column decoder 234. The column pre decoder 256 transfers, to the column decoder 234, multiplexed column addresses stored in the address register 212.

Figure 3:
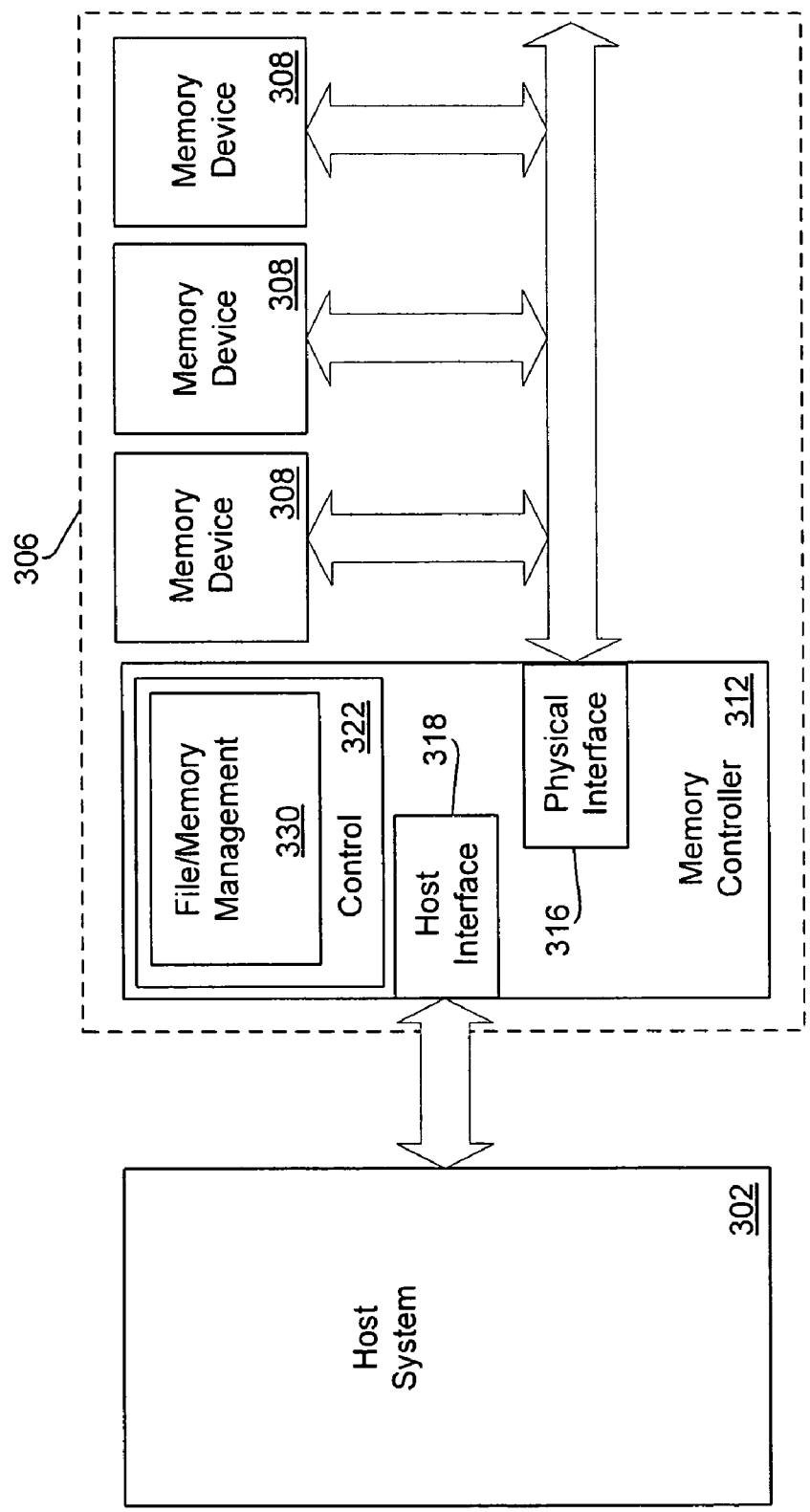
FIG. 3 is a block diagram of a host system and a memory system, the memory system including a number of memory devices which, in some examples, each correspond to the flash memory shown in FIG. 2.

Reference will now be made to FIG. 3. FIG. 3 is a block diagram of a host system 302 and a memory system 306 which can communicate with each other. The memory system 306 includes a number of memory devices 308. In some examples, each of the memory devices 308 corresponds to the flash memory 200 shown in FIG. 2. In other examples, only some of the memory devices 308 correspond to the flash memory 200 shown in FIG. 2, and the remaining memory devices 308 are some other type (or types) of nonvolatile memory devices that can function within the memory system 306. In still other examples, none of the memory devices 308 correspond to the flash memory 200 shown in FIG. 2, and instead all of the memory devices 308 are some other type (or types) of nonvolatile memory devices that can function within the memory system 306.

The memory system 306 also includes a memory controller 312 shown as in accordance with some examples. The illustrated memory controller 312 includes a physical interface 316, a host interface 318, and a control module 322. The physical interface 316 enables the memory controller 312 to communicate with the memory devices 308, and it also enables the memory devices 308 to communicate with the memory controller 312. The host interface 318 enables the memory controller 312 to communicate with the host system 302, and it also enables the host system 302 to communicate with the memory controller 312. The illustrated host interface 318 is shown within the memory controller 312; however in alternative examples the host interface may be implemented as a separate device or internal to a system in communication with the memory controller 312.

Still with reference to FIG. 3, the illustrated control module 322 includes a file/memory management submodule 330. Among other possible functions, the file/memory management submodule 330 provides mapping of logical addresses to physical addresses, so that the physical addresses of requested data can be determined. The mapping may further include algorithms that distribute and redistribute data stored at the devices to improve performance or perform so called "wear-leveling" and, when required, ensuring that physical addresses corresponding to bad memory cells are not made available or used by the host system. This latter mapping aspect is commonly referred to as "mapping out", which in the context of example embodiments is not limited to bad memory cells being mapped out. In particular, at a later point in the present disclosure, there is a description of how this "mapping out" can play a role in the handling of invalid addresses in non-power of two capacity memory devices.

In at least some examples of the memory controller 312, the control module 322 may include the following submodules at least some of which will be seen to be components of the file/memory management submodule 330: an allocator, a cleaner and a static wear-leveler. The allocator handles translation of logical addresses to physical addresses in accordance with any one of known translation mechanisms that are understood by those skilled in the art, such as, for example, NAND Flash Translation Layer (NFTL). With respect to the cleaner, it handles garbage collection to reclaim pages of invalid data in a manner understood by those skilled in the art. With respect to the static wear-leveler, it handles wear-leveling, characterized by data redistribution carried out in a manner consistent with achieving the intended goal, which is to evenly distribute the number of erasings for each block (because of the limitation on the number of erasings for blocks). The motivation of static wear-leveling is to prevent any "cold" data (as contrasted with "hot" data) from staying at any block for a long period of time. It is to minimize the maximum erase-count difference of any two blocks so that the lifetime of flash memory may be extended.

Figure 4B:
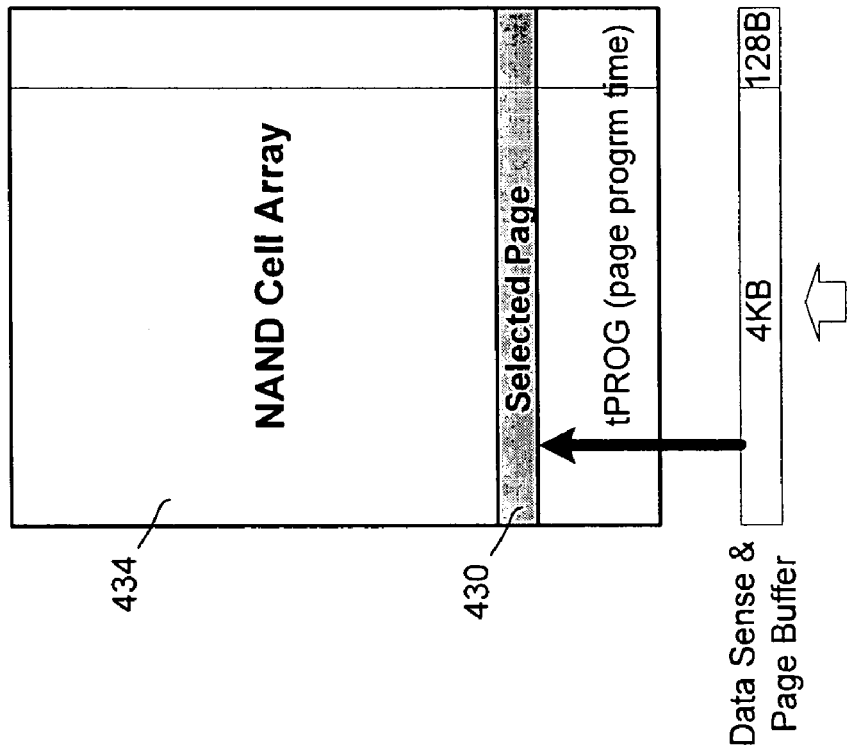
FIG. 4B is a block diagram illustrating a program operation in an example NAND flash device.
Figure 4A:
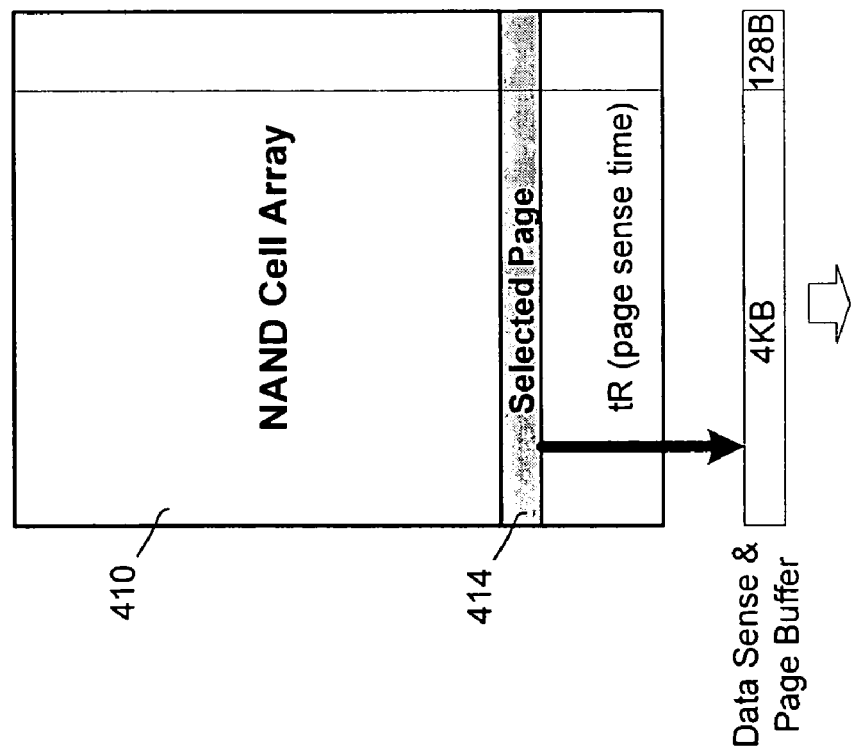
FIG. 4A is a block diagram illustrating a read operation in an example NAND flash device.

Reference will now be made to FIG. 4A. FIG. 4A is a block diagram illustrating a read operation in an example NAND flash device. Internal memory array 410 of the NAND flash device is accessed on a page basis (note example selected page 414). In the illustrated example of FIGS. 2 and 4A, the read operation starts after writing READ command followed by addresses via common I/O pins (I/O 0 to I/O 7) to the device 200. The sense amplifier and page buffer 230 senses and transfers the 4,224 bytes of data within the selected page 414 in less than tR (data transfer time from flash array to page buffer). Once the 4,224 bytes of data are sensed and transferred from the selected page 414 in the cell array 410 to the page buffer, the data in the page buffer can be sequentially read from the device 200. As shown in FIG. 4A, for every page of data there will be a spare field (in the illustrated example the spare field is 128 bytes; however in other examples the spare field could be any suitable number of bytes). The purpose of the spare fields is as follows: at power up of the memory system 306 and the memory controller 312 (FIG. 3) the control module 322 will want to get non-constant/variable information (for example, wear-leveling and address mapping related information) about the memory devices 308. It does this by dumping at least some of the data stored in the spare fields into SRAM storage [not explicitly shown] within the memory controller 312. Once the data from the spare fields is stored locally within the memory controller 312, the control module 322 can use the data to properly carry out its functions. For example, a map table within the SRAM storage is accessed in connection with the carrying out of logical to physical address translation.

In addition to the memory controller 312 being able to read from the spare fields, the memory controller 312 is also capable of updating data in the spare fields. FIG. 4B is a block diagram illustrating a program operation in an example NAND flash device. In connection with the program operation of the illustrated example, a PROGRAM command is followed by addresses and input data of 4,224 bytes, issued to the device 200 (FIG. 2) through common I/O pins (I/O 0 to I/O 7). The 4,224 bytes of data are transferred to the page buffer during input data loading cycles and finally programmed to a selected page 430 of cell array 434 in less than tPROG (page program time). As illustrated, the 4,224 bytes of data includes 128 bytes of spare field data, and furthermore the memory controller 312 (FIG. 3) is the originating generator (or originating modifier) of this additional data, such that in the case of FIG. 4B the spare field data is communicated from the memory controller 312 to the memory device 308, whereas in the case of FIG. 4A the spare field data is communicated from the memory device 308 to the memory controller 312.

Figure 5:
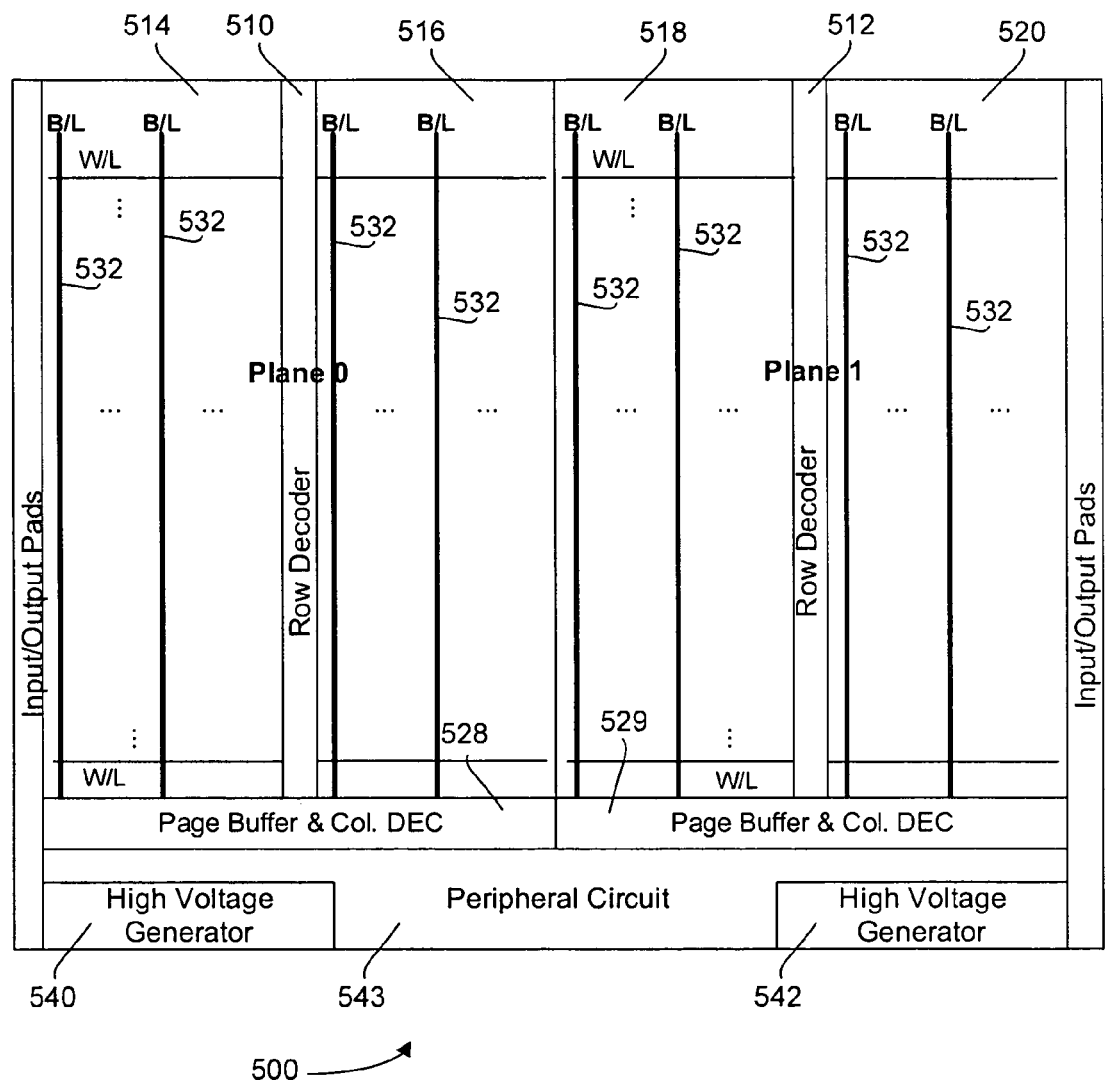
FIG. 5 is a block diagram of an example floor plan for a NAND flash chip fabricated in accordance with an example embodiment.

Reference will now be made to FIG. 5 which is a block diagram of an example floor plan 500 for a NAND flash chip fabricated in accordance with an example embodiment. In connection with FIG. 5, it will be seen that for ease of illustration some representative divisional units of the memory, such as planes and bit lines, have been shown, whereas other representative divisional units, such as pages and blocks, for example, have not been shown.

As was similarly explained in connection with FIG. 1, in the floor plan 500 of FIG. 5, two row decoder areas 510 and 512 extend between adjacent memory cell array areas 514 and 516, and 518 and 520 respectively. Also, extending along edges of the memory cell areas are elongate areas 528 and 529 within which can be found page buffers and column decoders of the flash memory device (as previously explained). Extending perpendicular to the lengths of the areas 528 and 529 are a plurality of significantly long bit lines 532. As will be appreciated by those skilled in the art, the bit lines 532 are typically electrically connected, in a distributively proportionate manner, to page buffers within the areas 528 and 529.

Because the bit lines 532 are significantly longer than bit lines that would otherwise be found in this memory device were it a power of two memory capacity device, correspondingly increased capacity is possible. In particular, it will be understood that longer bit lines facilitate fabrication of a device with a greater number of word lines, and hence a greater number blocks. For example, whereas each plane in a power of two memory capacity device might have say 2048 blocks (i.e. a binary number of blocks) each plane in a non-power of two memory capacity device having longer bit lines 532 might have say 2560 blocks (or some other suitable non-binary number of blocks).

It will be seen that an impact of fabrication with the longer bit lines 532 may be more efficient chip area usage. In particular, with respect to at least some example embodiments, various chip areas that are not a part of the memory cell arrays do not proportionally increase in size as the memory cell array areas 514, 516, 518 and 520 increase in size. In this regard, even though the bit lines 532 are significantly longer than the bit lines within the memory cell arrays shown in FIG. 1, the following areas shown in FIG. 5: high voltage generator areas 540 and 542, peripheral circuit area 543 and the areas 528 and 529, may be at least similar (if not the same) in size as compared to the corresponding areas shown in FIG. 1. For many applications, higher current on the $V_{cc}$ side may be expected, but this higher current should not be so sizable as to be of significant concern.

Figure 6:
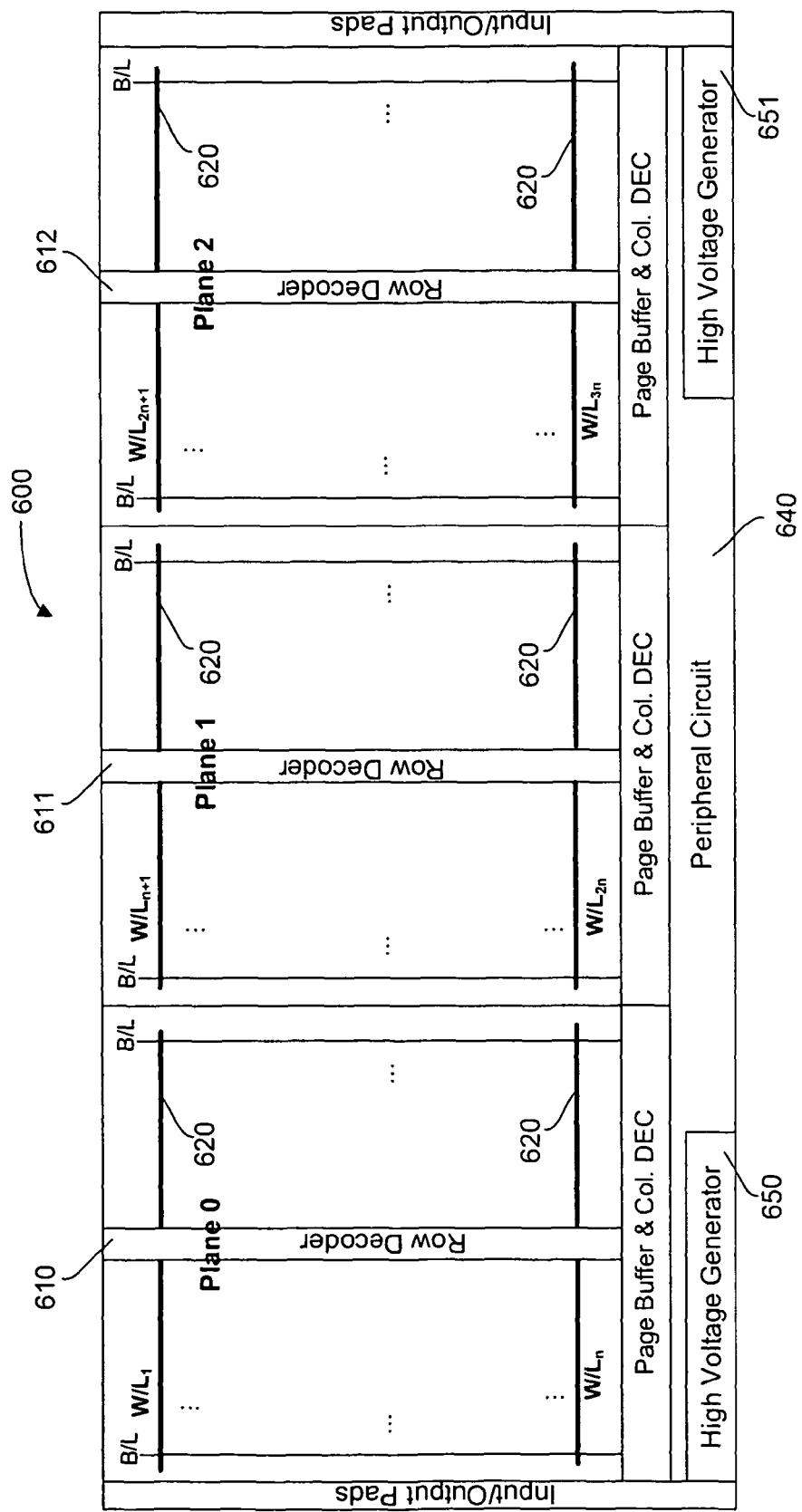
FIG. 6 is a block diagram of an example floor plan for a NAND flash chip fabricated in accordance with another example embodiment.

Reference will now be made to FIG. 6 which is a block diagram of an example floor plan 600 for a NAND flash chip fabricated in accordance with another example embodiment. In connection with FIG. 6, it will be seen that for ease of illustration some representative divisional units of the memory, such as planes and word lines, have been shown, whereas other representative divisional units, such as pages and blocks, for example, have not been shown.

It will be noted that in the illustrated example embodiment there are three row decoders 610-612, one for each of the planes labeled Plane 0, Plane 1 and Plane 2. Thus, for the example embodiment of FIG. 6 there is a non-power of two number of row decoders and planes (three) as contrasted with the NAND flash chip illustrated in FIG. 1, which has two row decoders and planes (i.e. a number which is a power of two). It will be understood that while the non-power of two number for the illustrated example embodiment is three, in other example embodiments the non-power of two number of row decoders and planes may be some other number such as, for example, five, six, seven, nine, etc. Also, it will be understood that, for the NAND flash device of the illustrated example embodiment, the total number of word lines 620 is 3 n (where n is the total number of word lines per plane) and thus the total number of word lines is non-power of two number because of the multiplication factor (three) being a non-power of two number. Because the total number of word lines is non-power of two number, a memory device fabricated in accordance with the illustrated example embodiment should have a capacity that is non-power of two as can be shown by capacity calculations which can be easily carried out by those skilled in the art.

Still with reference to the example embodiment illustrated in FIG. 6, from a chip area usage standpoint, the difference in dimensions of peripheral circuit area 640 relative to the peripheral circuit area 134 (FIG. 1) is noteworthy. The length of the peripheral circuit area 640 (as measured from one input/output pads area to the other) is larger than that of the peripheral circuit area 134. Also, the opposite dimension of the peripheral circuit area 640 is smaller than the corresponding dimension of the peripheral circuit area 134. Analogizing to pizza dough or a pancake, the peripheral circuit area has been flattened (squeezed) down.

Figure 7:
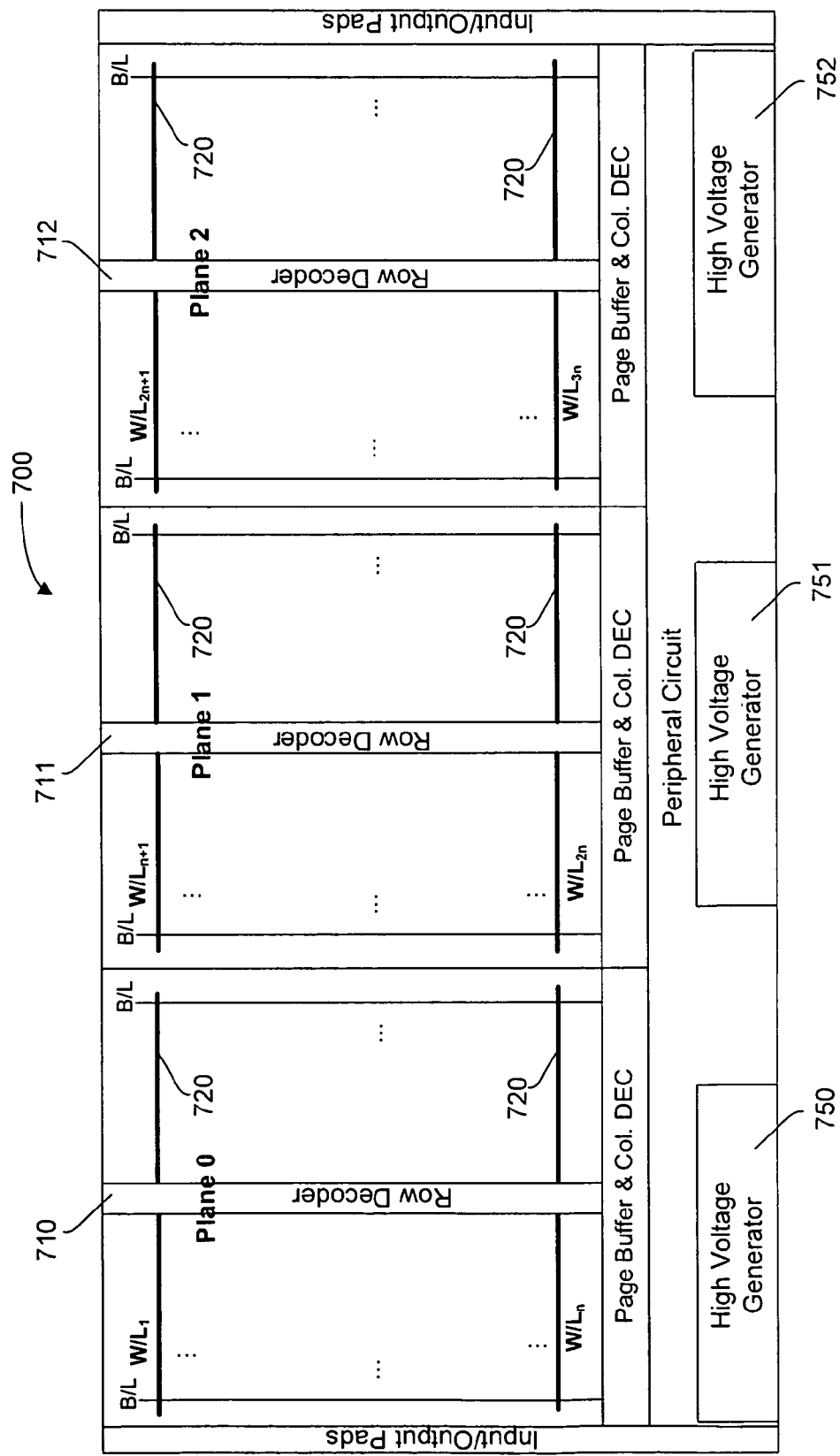
FIG. 7 is a block diagram of an example floor plan for a NAND flash chip fabricated in accordance with yet another example embodiment.

Reference will now be made to FIG. 7 which is a block diagram of an example floor plan 700 for a NAND flash chip fabricated in accordance with yet another example embodiment. Again there are three row decoders 710-712 shown in the illustrated example embodiment, one for each of the planes labeled Plane 0, Plane 1 and Plane 2. Likewise, the total number of word lines 720 is 3 n (where n is the total number of word lines per plane) and thus the total number of word lines is non-power of two number because of the multiplication factor (three) being a non-power of two number. The primary difference between the example embodiment of FIG. 7 and the example embodiment of FIG. 6 is the presence of three high voltage generator areas 750-752 versus two high voltage generator areas 650-651. Thus, there is an additional high voltage generator in the example embodiment of FIG. 7 as compared to the example embodiment of FIG. 6. Because of the additional high voltage generator, those skilled in the art will appreciate that such a design may be chosen over the other design with less voltage generators in certain instances, such as when the benefit of the higher performance achieved in relation to memory device operations over the other design outweighs less efficient chip area usage as measured in terms of chip area which contains the memory cells relative to the total chip area. For many applications, higher currents for both $V_{cc}$ and $V_{pp}$ may be expected in conjunction with example embodiment of FIG. 7; however these higher currents should not be so sizable as to be of significant concern.

Other combinations of number planes and number of high voltage generators are contemplated. For example, five planes and three, four or five high voltage generators, six planes and four, five or six high voltage generators, etc.

It will be understood that in going from a power of two memory capacity device to a higher capacity non-power of two memory capacity device, an increase in address length by at least one bit is to be expected. As an example, say addresses of 24 bits in length are employed in a first memory device having power of two memory capacity, then for a second memory device having a memory capacity that is non-power of two and larger than the first device, it would be expected that addresses would be at least 25 bits in length.

In connection with a power of two memory capacity device it is theoretically possible (though not in actuality because of, for example, mapping out of bad cells) for each and every logical address to correspond to a valid physical address. For a non-power of two memory capacity device however, this cannot be the case. Because logical addresses are binary, the total count of all possible logical addresses will be a number that is some power of two. So, for example, it would be expected that for a 24 GB (non-power of two) capacity memory device, roughly 32 billion would be the total count of all possible logical addresses, meaning roughly 8 billion or more logical addresses would not have a corresponding valid physical address. Nevertheless, mapping out of invalid physical addresses can be taken care on the controller side by the file/memory management submodule 330 shown in FIG. 3, in a manner analogous to the mapping out of bad cells as understood by those skilled in the art.

Figure 8:
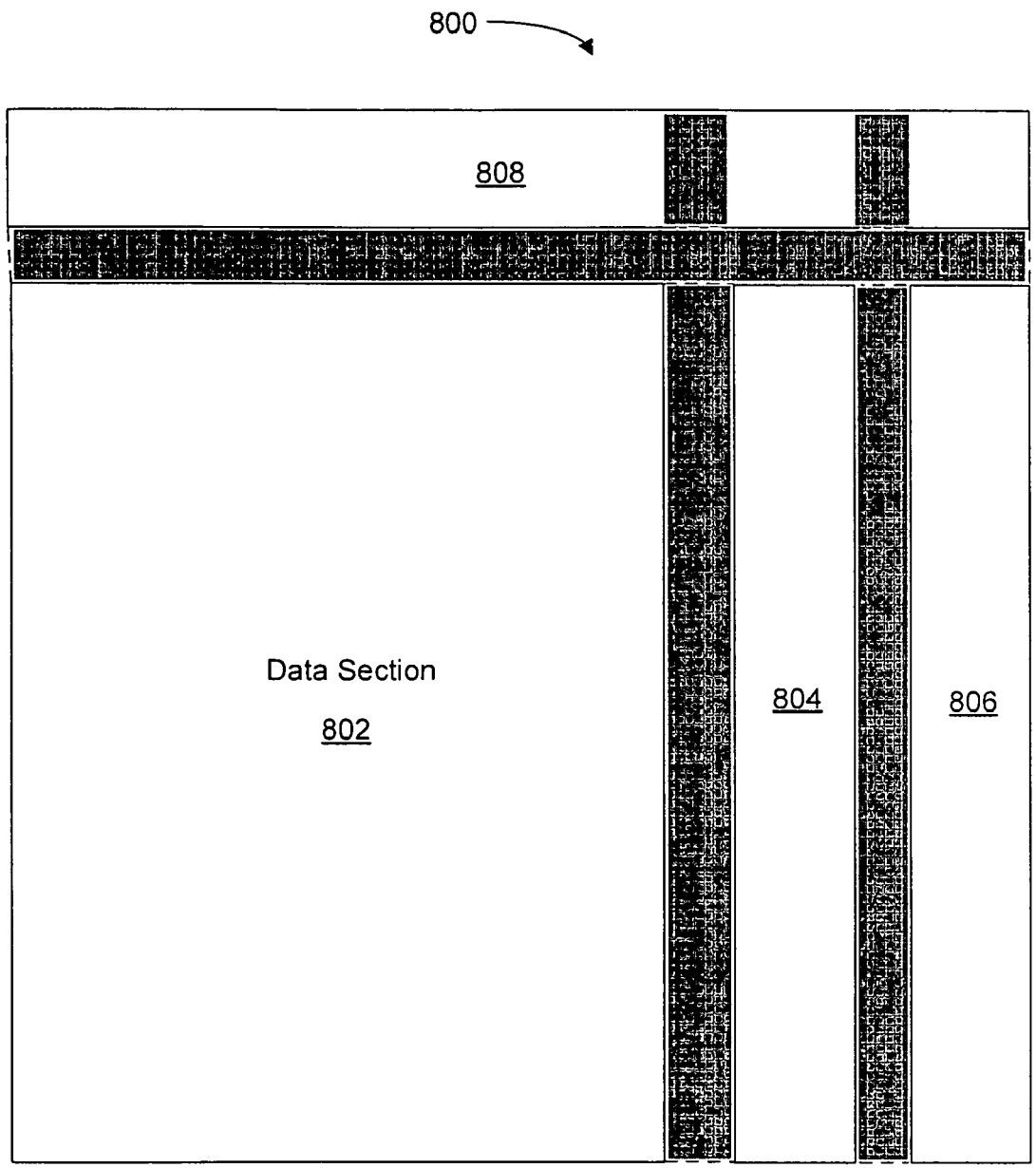
FIG. 8 is a block diagram of an example plane of a NAND flash chip, the diagram illustrating redundant and other sections of the plane.

It will be understood that the term "capacity" as used herein is capacity exclusive of non-data capacity or substitution capacity. In this regard, FIG. 8 is a block diagram of an example plane 800 of a NAND flash chip, and the diagram has been included in the drawings to explicitly clarify data capacity distinct from non-data capacity (or substitution capacity). The illustrated example plane 800 comprises four sections: a data section 802, a spare fields section 804, a redundant column(s) section 806, and a redundant block(s) section 808 (it should be noted that in alternative examples the plane may not have the redundant column(s) section 806, or it may not have the redundant block(s) section 808, or it may not have either the section 806, 808, or even still there may be some other type of secondary section that has a similar relevant purpose to the secondary sections presently described). The spare fields section 804 is a section of the plane 800 which corresponds to the spare fields of memory pages as previously explained. It will be understood that the spare fields section 804 has an associated non-data capacity. The redundant column(s) section 806 is a section of the plane 800 which corresponds to redundant column(s) of the plane 800 that in cases where defects arise can function as substitute columns for columns within the data section 802. It will be understood that the redundant column(s) section 806 has an associated substitution capacity. The redundant block(s) section 808 is a section of the plane 800 which corresponds to redundant block(s) which serve a similar purpose as redundant column(s) within the redundant column(s) section 806. It will be understood that the redundant block(s) section 808 has an associated substitution capacity. The remaining section is the data section 802. In conventional NAND flash the following holds: 1) the data section 802 has a power of two capacity; and 2) the data fields within the data section 802, which are the portions of pages exclusive of spare fields, have a power of two capacity.

Certain adaptations and modifications of the described embodiments can be made. Therefore, the above discussed embodiments are considered to be illustrative and not restrictive.

What is claimed is:

1. A nonvolatile memory device comprising:
a plurality of planes totaling three, five, six or seven in number, and said plurality of planes each comprising a data section, a spare fields section and a redundant column or columns section, and said plurality of planes each including a plurality of blocks with each said blocks divided into a number of pages and each said blocks defined along a first dimension by a first number of memory cells for storing data, and along a second dimension by a second number of memory cells for storing data, the nonvolatile memory device having a non-power of two capacity;
a plurality of high voltage generators totaling less in number than the number of planes, a first of the plurality of high voltage generators for providing high voltages in connection with operations that occur in a first of the plurality of planes, a second of the plurality of high voltage generators for providing high voltages in connection with operations that occur in a second of the plurality of planes; and
a plurality of row decoders in each said plurality of planes, and an at least substantially one-to-one relationship existing, in the nonvolatile memory device, for number of row decoders to number of pages, and each said row decoders configured to facilitate a read operation on an associated page of the nonvolatile memory device.

2. The nonvolatile memory device as claimed in claim 1 wherein said plurality of row decoders is a non-power of two number of row decoders.

3. The nonvolatile memory device as claimed in claim 1 wherein a third of the plurality of planes is configured to receive high voltages from the first of the plurality of high voltage generators.

4. The nonvolatile memory device as claimed in claim 1 wherein the nonvolatile memory device is a flash memory device.

5. The nonvolatile memory device as claimed in claim 1 wherein the nonvolatile memory device is a NAND flash memory device.

6. A memory system comprising:
the nonvolatile memory device as claimed in claim 1; and
a controller in communication with said nonvolatile memory device, said controller including storage and a management module, said storage storing a map table, said management module configured to access the map table to carry out translation of logical addresses to physical addresses, and invalid physical addresses attributable to the non-power of two capacity of said nonvolatile memory device being mapped out in the map table.

7. The memory system as claimed in claim 6 wherein said nonvolatile memory device has a non-power of two number of row decoders.

8. The memory system as claimed in claim 6 wherein said nonvolatile memory device is a NAND flash memory device, and said management module includes an allocator for handling translation of logical addresses to physical addresses in accordance with NAND Flash Translation Layer (NFTL).

9. The memory system as claimed in claim 6 wherein said nonvolatile memory device is a flash memory device.

10. The memory system as claimed in claim 6 wherein said nonvolatile memory device is a NAND flash memory device.

11. The memory system as claimed in claim 6 wherein said nonvolatile memory device fits within a 48-pin TSOP-1 package.

12. The nonvolatile memory device as claimed in claim 1 wherein said plurality of high voltage generators comprise a plurality of charge pumps.

13. The nonvolatile memory device as claimed in claim 1 wherein the nonvolatile memory device fits within a 48-pin TSOP-1 package.

* * * * *